(12) United States Patent
Schedelbeck et al.

(10) Patent No.: US 11,817,878 B2
(45) Date of Patent: Nov. 14, 2023

(54) MULTI-CHANNEL DECODER WITH DISTRIBUTED SCHEDULING

(71) Applicant: MaxLinear, Inc., Carlsbad, CA (US)

(72) Inventors: Gert Schedelbeck, Munich (DE); Stefan Uhlemann, Munich (DE)

(73) Assignee: MaxLinear, Inc., Carlsbad, CA (US)

( * ) Notice: Subject to any disclaimer, the term of this patent is extended or adjusted under 35 U.S.C. 154(b) by 888 days.

(21) Appl. No.: 16/196,422

(22) Filed: Nov. 20, 2018

(65) Prior Publication Data
US 2019/0089373 A1 Mar. 21, 2019

(51) Int. Cl.
| | |
|---|---|
| H03M 13/11 | (2006.01) |
| H03M 13/00 | (2006.01) |
| H04L 12/28 | (2006.01) |
| H03M 13/37 | (2006.01) |
| H04L 12/64 | (2006.01) |

(52) U.S. Cl.
CPC ...... *H03M 13/114* (2013.01); *H03M 13/1102* (2013.01); *H03M 13/3707* (2013.01); *H03M 13/3715* (2013.01); *H03M 13/6502* (2013.01); *H03M 13/6561* (2013.01); *H04L 12/2874* (2013.01); *H03M 13/1108* (2013.01); *H03M 13/1117* (2013.01); *H04L 2012/6478* (2013.01); *H04L 2012/6489* (2013.01)

(58) Field of Classification Search
CPC ........... H03M 13/114; H03M 13/1102; H03M 13/3707; H03M 13/3715; H03M 13/6502; H03M 13/6561; H03M 13/1108; H03M 13/1117; H04L 12/2874; H04L 2012/6478; H04L 2012/6489
See application file for complete search history.

(56) References Cited

U.S. PATENT DOCUMENTS

| | | | |
|---|---|---|---|
| 4,980,897 A * | 12/1990 | Decker | H04L 5/00 375/260 |
| 6,594,319 B1 * | 7/2003 | Shaikh | H03M 13/25 375/265 |
| 7,958,424 B2 | 6/2011 | Kons et al. | |
| 8,861,738 B2 | 10/2014 | Kim et al. | |

(Continued)

OTHER PUBLICATIONS

Mazzarese, David. "Minimizing PMD in Cabled Fibers, Critical for Current and Future Network Applications." ofs Leading Optical Innovations. 6 pages.

(Continued)

*Primary Examiner* — April Y Blair
*Assistant Examiner* — Rong Tang
(74) *Attorney, Agent, or Firm* — Buchalter; Jason W. Croft

(57) ABSTRACT

A multi-channel decoder circuit associated with a multi-channel decoder system is disclosed. The multi-channel decoder circuit comprises a distributed decoder circuit comprising a set of unit decoder circuits, each unit decoder circuit configured to receive one or more codewords of a plurality of codewords associated with a plurality of input channels, and decode the one or more codewords. The multi-channel decoder circuit further comprises a distribution controller circuit configured to distribute each incoming codeword of the one or more codewords to the respective unit decoder circuit of the set of unit decoder circuits within the distributed decoder circuit, based on determining a currently available unit decoder circuit within the set of unit decoder circuits.

29 Claims, 9 Drawing Sheets

(56) References Cited

U.S. PATENT DOCUMENTS

| | | | |
|---|---|---|---|
| 9,992,124 B2 * | 6/2018 | Seely | H04W 52/0229 |
| 2002/0186798 A1 * | 12/2002 | Park | H04L 1/0051 |
| | | | 375/341 |
| 2004/0125816 A1 * | 7/2004 | Xu | H04N 21/23406 |
| | | | 370/411 |
| 2017/0180736 A1 * | 6/2017 | Yang | H04N 21/2402 |
| 2019/0165809 A1 * | 5/2019 | Tseng | H03M 13/616 |

OTHER PUBLICATIONS

Laubach, Mark et al. "FEC Proposal for NGEPON." Broadcom. May 15, 2017. 29 pages.

Laubach, Mark et al. "LDPC Adjustments from Motion #6, Chicago." Broadcom. May 14, 2018 IEEE 802.3 Interim, Pittsburgh, PA. 10 pages.

Laubach, Mark et al. LDPC Parity Code Matrix Update for Improved Alignment (rev 1a). Broadcom. Mar. 5, 2018 IEEE 802.3 Plenary, Chicago, IL. 11 pages.

"Low Density Parity Check Coding." Draft. 3 pages.

"IEEE 802.3an LDPC Encoder/Decoder Core." Whitepaper. TurboBest, Best IP Fec Cores. 4 pages.

* cited by examiner

MULTI-CHANNEL DECODER WITH DISTRIBUTED SCHEDULING

FIELD

The present disclosure relates to multi-channel decoder systems, and in particular, to a system and method for distributed scheduling in multi-channel decoder systems.

BACKGROUND

With the advancement in communication technologies, many emerging communication systems utilizes multi-channel receivers, where signals from several input channels are received on a common device. For improved performance channel coding is widely used and needs an appropriate decoder in the receiver. For example, low-density parity-check (LDPC) codes are increasingly used in many new access technologies as for instance 25G ethernet passive optical network (EPON) or MGFAST, because they achieve correction capabilities close to the Shannon limit, while processing requirements can be met by latest complementary metal oxide semiconductor (CMOS) technology. For efficient operation of the multi-channel receivers, multi-channel decoder systems that achieve high throughput and meet low power budgets of mobile platforms needs to be implemented.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
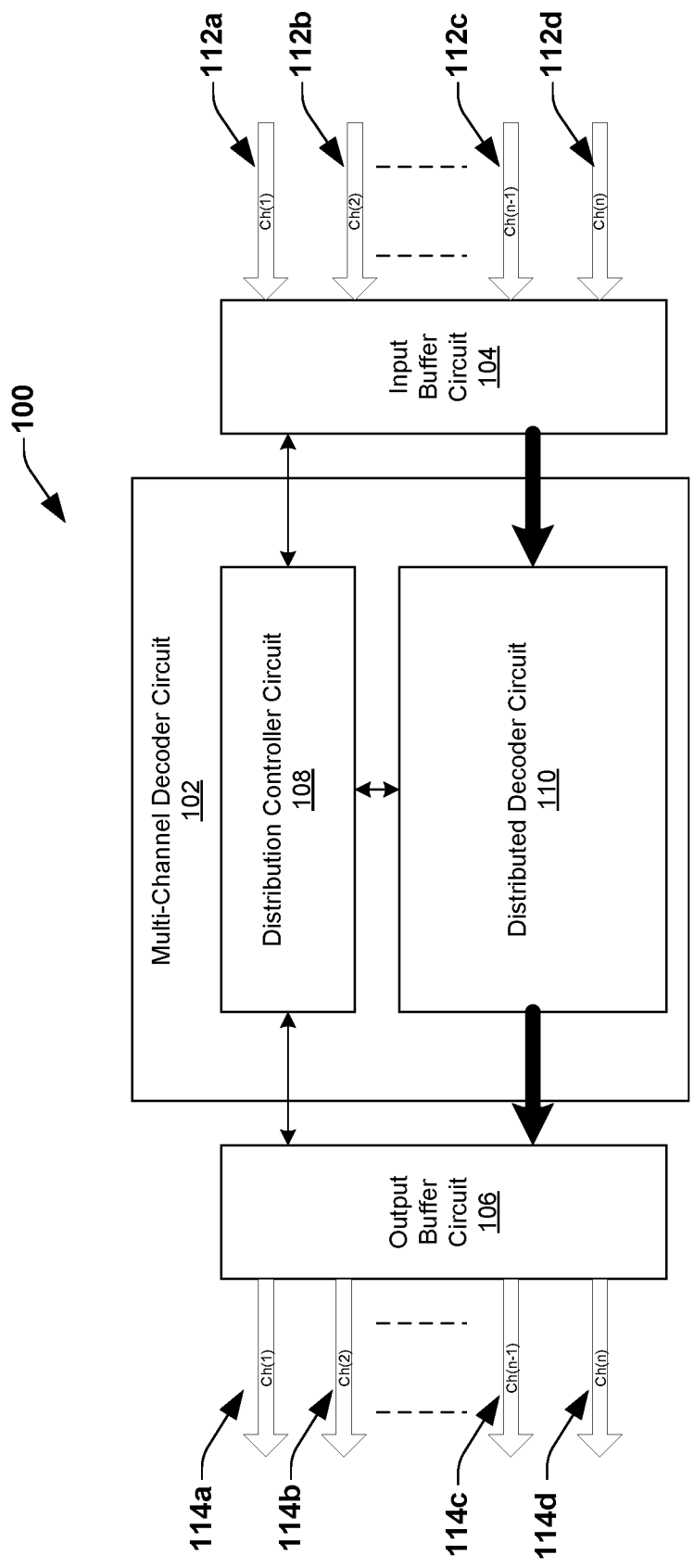
FIG. 1 illustrates a simplified block diagram of a multi-channel decoder system, according to one embodiment of the disclosure.

In one embodiment of the disclosure, a multi-channel decoder circuit is disclosed. The multi-channel decoder circuit comprises a distributed decoder circuit comprising a set of unit decoder circuits, each unit decoder circuit configured to receive one or more codewords of a plurality of codewords associated with a plurality of input channels, and decode the one or more codewords. The multi-channel decoder circuit further comprises a distribution controller circuit configured to distribute each incoming codeword of the one or more codewords to the respective unit decoder circuit of the set of unit decoder circuits within the distributed decoder circuit, based on determining a currently available unit decoder circuit within the set of unit decoder circuits.

In one embodiment of the disclosure, a multi-channel decoder system is disclosed. The multi-channel decoder system comprises a multi-channel decoder circuit comprising a distributed decoder circuit comprising a set of unit decoder circuits, each unit decoder circuit configured to receive one or more codewords of a plurality of codewords associated with a plurality of input channels, and decode the one or more codewords. The multi-channel decoder circuit further comprises a distribution controller circuit configured to distribute each incoming codeword of the one or more codewords to the respective unit decoder circuit of the set of unit decoder circuits, based on determining a currently available unit decoder circuit within the set of unit decoder circuits.

In one embodiment of the disclosure, a method for a multi-channel decoder circuit is disclosed. The method comprises receiving, at each unit decoder circuit of a set of unit decoder circuits associated with a distributed decoder circuit, one or more codewords of a plurality of codewords associated with a plurality of input channels, and processing the one or more codewords. The method further comprises distributing each incoming codeword of the one or more codewords to the respective unit decoder circuit of the set of unit decoder circuits within the distributed decoder circuit, by a distribution controller circuit, based on determining a currently available unit decoder circuit within the set of unit decoder circuits.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from conte8, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from conte8 to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, efficient implementation of multi-channel decoder systems is required for the efficient operation of multi-channel receivers. In multi-channel applications, the input data is received from a plurality of individual channels and decoded by a plurality of decoders. In typical implementations, multi-channel decoder systems comprise one individual decoder for each input channel. In decoders, the actual processing time of a codeword is variable and depends for instance on the amount of iterations needed to decode the codeword successfully. The number of iterations i may vary from i=0 up to a maximum amount of iterations i_max. i_max is chosen so that the output maximum bit error rate (BER) and maximum latency targets are just met. However, in some implementations of multi-channel decoders, each individual decoder will require less than the maximum number of iterations to correct most codewords. So, most of the time many decoder resources are in an idle state and the utilization is poor. Therefore, such an implementation may consume lots of die size and power, especially for high channel count n, while the utilization of resources may be poor.

Further, in some other implementations, in case that a decoder can correct a codeword(n) in a few iterations (i<i_average), the spare iterations from codeword(n) is used for one of the following codewords(n+x), which may need additional iterations for successful decoding (i.e., statistical decoding). However, in many access technologies the input data is received at a constant rate or at least at a constant rate over a time that is long compared to the time to receive one codeword. That means, a codeword is received at the receiver every few (data_rate/codeword_size) seconds, and the receiver has no means to quickly decrease the input data rate in case it needs more time for decoding of the current codeword (i.e. no flow control/backpressure). The potential gain of statistical decoding may be realized only in systems where the input data rate can be adjusted to the actual time for decoding. In systems with a constant input data rate that is not under control of the decoder, buffering would be required at the input of the decoder to store subsequent input codewords during longer processing of the current codeword. Furthermore, in systems with constant processing delay requirements the data output needs de-jitter buffers to equalize the processing delay variations. Both requirements would call for extensive buffering that increases the maximum processing delay, thereby reducing the efficiency of the multi-channel decoder systems.

In order to overcome the above disadvantages, a system and a method for a multi-channel decoder system that utilizes distributed scheduling is proposed in this disclosure. In particular, in one embodiment, a multi-channel decoder circuit that comprises a set of unit decoder circuits is proposed herein. In some embodiments, each of the unit decoder circuit is configured to receive and process one or more codewords of a plurality of codewords associated with a plurality of input channels. In some embodiments, the multi-channel decoder circuit further comprises a distribution controller circuit configured to distribute each incoming codeword of the one or more codewords to the respective unit decoder circuit of the set of unit decoder circuits, based on determining a currently available unit decoder circuit within the set of unit decoder circuits. In some embodiments, a number of unit decoder circuits within the set of unit decoder circuits in the proposed multi-channel decoder circuit is less than a number of input data channels within the plurality of input data channels. In some embodiments, the proposed multi-channel decoder circuit enables to improve the utilization of resources associated with the decoder circuit and also reduce the area and power consumption.

FIG. 1 illustrates a simplified block diagram of a multi-channel decoder system 100, according to one embodiment of the disclosure. In some embodiments, the multi-channel decoder system 100 may be included within multi-channel receivers associated with any communication systems, for example, passive optical network (PON) systems, digital subscriber line (xDSL) systems etc. The multi-channel decoder system 100 comprises a multi-channel decoder circuit 102, an input buffer circuit 104 and an output buffer circuit 106. In some embodiments, the input buffer circuit 104 may comprise a plurality of unit input buffer circuits configured to store codewords respectively associated with a plurality of input channels 112a, 112b etc. In some embodiments, the codewords associated with different input channels may be configured to arrive at the respective unit input buffer circuit one after the other, for example, a staggered alignment of codeword boundaries between channels. However, in other embodiments, the codewords associated with different input channels may be configured to arrive at the respective unit input buffer circuits at the same time or without any predefined timing alignment. In this embodiment, the input buffer circuit 104 and the output buffer circuit 106 are implemented as separate circuits. However, in other embodiments, the input buffer circuit 104 and output buffer circuit 106 may be implemented as a common, shared buffer circuit.

In some embodiments, the multi-channel decoder circuit 102 comprises a distribution controller circuit 108 and a distributed decoder circuit 110. In some embodiments, distributed decoder circuit 110 may comprise a set of unit decoder circuits. In some embodiments, the unit decoder circuits may comprise low-density parity-check (LDPC) decoder circuits. However, in other embodiments, the unit decoder circuits may be implemented differently. In some embodiments, a number of unit decoder circuits within the set of unit decoder circuits is less than a number of input channels within the plurality of input channels (or the plurality of unit buffer circuits associated therewith). However, in other embodiments, the number of unit decoder circuits within the set of unit decoder circuits may be equal or greater than the number of input channels within the plurality of input channels (or the plurality of unit buffer circuits associated therewith). In some embodiments, each unit decoder circuit of the set of unit decoder circuits may be configured to receive one or more codewords of a plurality of codewords associated with the plurality of input channels 112a, 112b etc. and process the one or more codewords. In particular, each unit decoder circuit of the set of unit decoder circuits may be configured to receive one or more codewords of a plurality of codewords associated with the plurality of input channels 112a, 112b etc. from the plurality of unit input buffer circuits within the input buffer circuit 104. In some embodiments, the distribution controller circuit 108 may be configured to distribute each incoming codeword of the one or more codewords to the respective unit decoder circuit of the set of unit decoder circuits, based on determining a currently available unit decoder circuits within the set of unit decoder circuits, further details of which are given in embodiments below.

In some embodiments, the multi-channel decoder circuit 102 may further comprise a dedicated decoder circuit (not shown) comprising a plurality of unit channel decoder circuits respectively associated with the plurality of input channels. In some embodiments, each of the plurality of unit channel decoder circuits is configured to decode/process codewords associated with a respective input channel of the plurality of input channels, thereby forming processed codewords, prior to providing the codewords to the distributed decoder circuit 110. Therefore, in such embodiments, the codewords received at the distributed decoder circuit 110 comprises processed codewords, further details of which are provided in an embodiment below. The output buffer circuit 106 is coupled to the multi-channel decoder circuit 102 and is configured to receive and store decoded codewords at the output of the multi-channel decoder circuit 102. In some embodiments, the output buffer circuit 106 may comprise a plurality of unit output buffer circuits respectively associated with a plurality of output channels 114a, 114b etc. In some embodiments, each of the unit output buffer circuit may be configured to receive decoded codewords associated with a respective output channel. In some embodiments, the distribution controller circuit 108 may be further configured to distribute the decoded codewords from the set of unit decoder circuits to the plurality of unit output buffer circuits. In some embodiments, although not shown herein, a direct coupling may exist between the input buffer circuit 104 and the output buffer circuit 106, and the input buffer circuit 104 may be configured to transfer one or more codewords to the output buffer circuit 106 directly (without providing the one or more codewords to the multi-channel decoder circuit 102 for decoding), at least in some embodiments.

Figure 2:
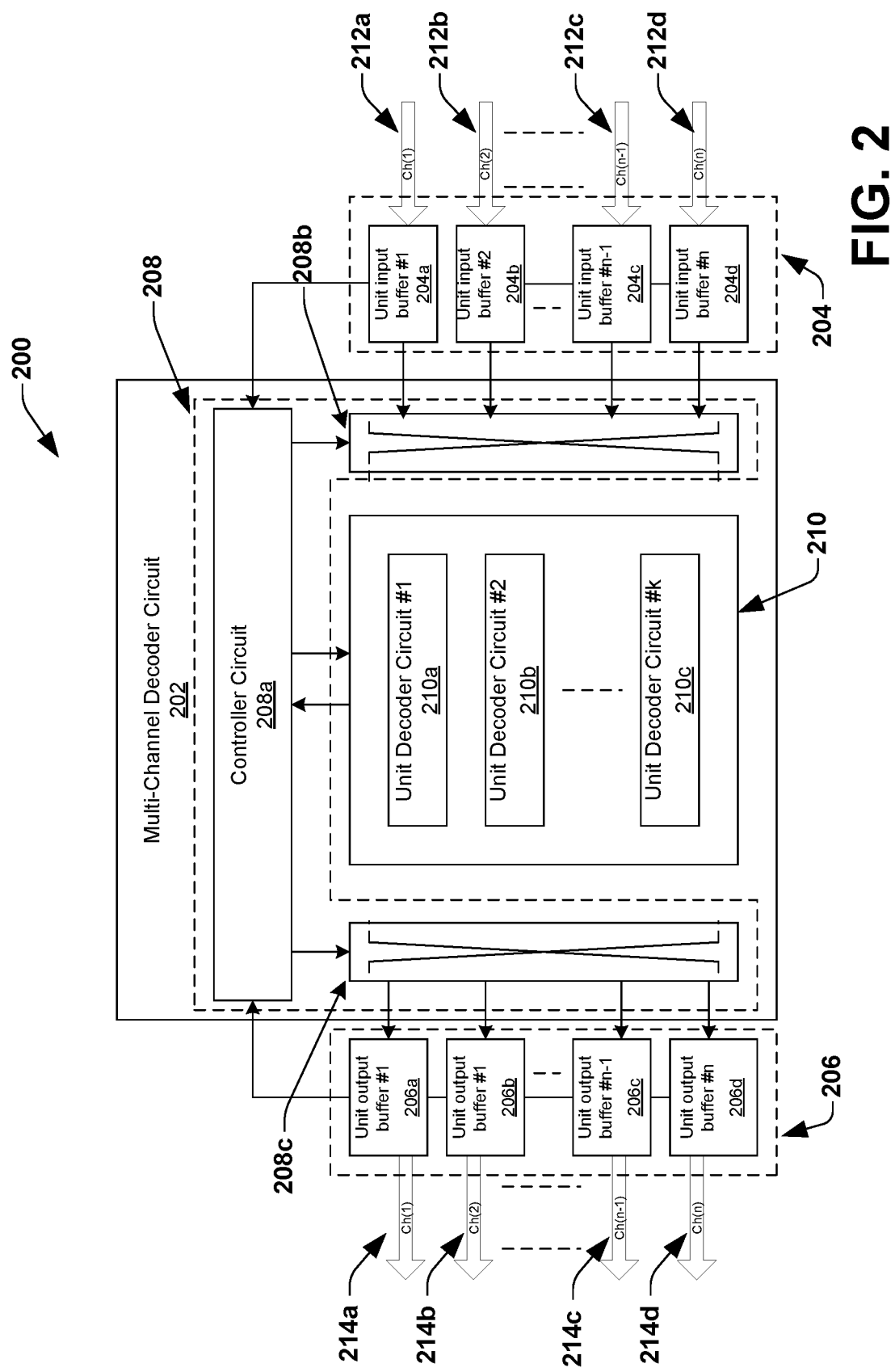
FIG. 2 illustrates an example implementation of a multi-channel decoder system, according to one embodiment of the disclosure.

FIG. 2 illustrates an example implementation of a multi-channel decoder system 200, according to one embodiment of the disclosure. In some embodiments, the multi-channel decoder system 200 may be included within multi-channel receivers associated with any communication systems, for example, passive optical network (PON) systems, digital subscriber line (xDSL) systems etc. In some embodiments, the multi-channel decoder system 200 comprises one possible way of implementation of the multi-channel decoder system 100 in FIG. 1. The multi-channel decoder system 200 comprises a multi-channel decoder circuit 202, an input buffer circuit 204 and an output buffer circuit 206. The input buffer circuit 204 comprises a plurality of unit input buffer circuits 204a, 204b etc. configured to store incoming codewords respectively associated with a plurality of input channels 212a, 212b etc. In some embodiments, the codewords associated with different input channels may be configured to arrive at the respective unit input buffer circuit one after the other, for example, a staggered alignment of codeword boundaries between channels. However, in other embodiments, the codewords associated with different input channels may be configured to arrive at the respective unit input buffer circuits at the same time or without any predefined timing alignment.

The multi-channel decoder circuit 202 comprises a distributed decoder circuit 210 and a distribution controller circuit 208. In some embodiments, the distributed decoder circuit 210 comprises a set of unit decoder circuits 210a, 210b etc. In some embodiments, a number of unit decoder circuits #k within the set of unit decoder circuits 210a, 210b etc. is less than a number of input channels #n within the plurality of input channels 212a, 212b etc. (or the plurality of unit buffer circuits associated therewith). However, in other embodiments, the number of unit decoder circuits #k within the set of unit decoder circuits may be equal or greater than the number of input channels #n within the plurality of input channels (or the plurality of unit buffer circuits associated therewith). In some embodiments, each unit decoder circuit of the set of unit decoder circuits 210a, 210b etc. is configured to receive one or more codewords of a plurality of codewords associated with the plurality of input channels 212a, 212b etc. and decode the one or more codewords. In particular, each unit decoder circuit of the set of unit decoder circuits 210a, 210b etc. may be configured to receive one or more codewords of the plurality of codewords associated with the plurality of input channels 212a, 212b etc. from the plurality of unit input buffer circuits 204a, 204b etc. within the input buffer circuit 204.

In some embodiments, the distribution controller circuit 208 may be configured to distribute each incoming codeword of the one or more codewords to the respective unit decoder circuit of the set of unit decoder circuits 210a, 210b etc., based on determining a currently available unit decoder circuit within the set of unit decoder circuits 210a, 210b etc. In some embodiments, the distribution controller circuit 208 may be configured to distribute each incoming codeword of the one or more codewords to the respective unit decoder circuit of the set of unit decoder circuits 210a, 210b etc. in accordance with a predefined distribution control algorithm, the details of which are given in an embodiment below. In some embodiments, the distribution controller circuit 208 comprises a controller circuit 208a, an input distribution network circuit 208b and an output distribution network circuit 208c. In some embodiments, the controller circuit 208a is configured to identify an arrival of each incoming codeword of the plurality of codewords associated with the plurality of input channels and determine a currently available unit decoder circuit within the set of unit decoder circuits 210a, 210b etc., in order to distribute each of the respective incoming codeword. In some embodiments, identifying an arrival of each incoming codeword of the plurality of codewords associated with the plurality of input channels comprises identifying an arrival of each incoming codeword of the plurality of codewords within the input buffer circuit 204. In some embodiments, when multiple codewords respectively associated with multiple different input channels arrive simultaneously at the input buffer circuit 204, the controller circuit 208 may be configured to distribute each incoming codeword of the multiple codewords in a predefined order in accordance with some predefined condition, for example, based on the quality-of-service class of the incoming codewords. For example, the controller circuit 208a may be configured to schedule the distribution of an incoming codeword with higher QoS class first, followed by an incoming codeword with a lesser QoS class. However, in other embodiments, the multiple incoming codewords may be scheduled to be distributed differently than above.

In some embodiments, the input distribution network circuit 208b is coupled to the controller circuit 208a and is configured to distribute each incoming codeword of the plurality of codewords associated with the plurality of input channels to the respective unit decoder circuit (i.e., a currently available decoder circuit), based on instructions from the controller circuit 208a. In some embodiments, the output distribution network circuit 208c is configured to distribute decoded codewords from the set of unit decoder circuits to a plurality of respective output channels 214a, 214b etc., based on instructions from the controller circuit 208a. In some embodiments, the output buffer circuit 206 is coupled to the output distribution network circuit 208c and is configured to receive and store the decoded codewords from the set of unit decoder circuits 210a, 210b etc. In some embodiments, the output buffer circuit 206 comprises a plurality of unit output buffer circuits 206a, 206b etc. respectively associated with the plurality of output channels 214a, 214b etc. In such embodiments, the controller circuit 208a is further configured to determine a respective unit output buffer circuit to which a decoded codeword at the output of the distributed decoder circuit 210 needs to be distributed and provide instructions to the output distribution network circuit 208c based thereon.

Figure 3:
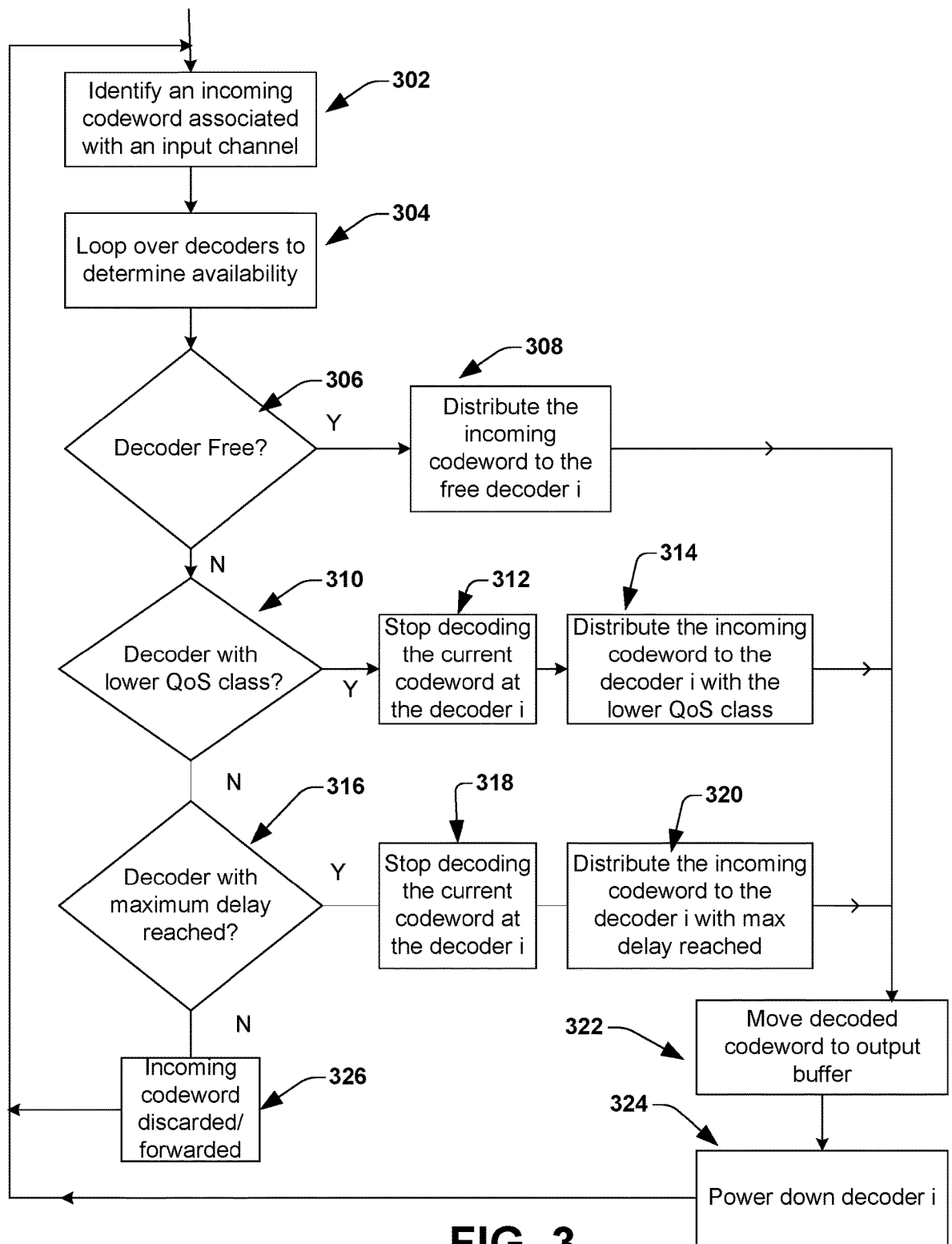
FIG. 3 illustrates a simplified flow diagram of a distribution control algorithm, according to one embodiment of the disclosure.

FIG. 3 illustrates a simplified flow diagram of a distribution control algorithm 300, according to one embodiment of the disclosure. In some embodiments, the distribution control algorithm 300 may be implemented within the distribution controller circuit 208 (in particular, the controller circuit 208a) in FIG. 2. However, in other embodiments, the distribution control algorithm 300 may be implemented within any other distribution controller circuits, for example, the distribution controller circuit 108 in FIG. 1. The distribution control algorithm 300 is explained herein with reference to the multi-channel decoder system 200 in FIG. 2. At 302, an incoming codeword associated with an input channel is identified. In some embodiments, identifying an incoming codeword associated with an input channel comprises identifying an incoming codeword within a respective unit buffer circuit within an input buffer circuit (e.g., the input buffer circuit 204 in FIG. 2). In some embodiments, the point of time when an incoming codeword is received (e.g. t0) within the unit input buffer circuit is also recorded at 302. In some embodiments, this arrival time may be used to monitor the actual processing delay ($\Delta t$) for the respective codeword, and determine when the maximum allowed delay is exceeded (i.e. t0+$\Delta t$>tmax) for the respective codeword. At 304, a set of unit decoder circuits (e.g., the set of unit decoder circuits 210a, 210b etc. in FIG. 2) is looped over to determine availability. At 306, a determination whether a unit decoder circuit within the set of unit decoder circuits is free is made. If yes at 306, the algorithm proceeds to 308, where the incoming codeword is distributed to a free unit decoder circuit i. Here, i may refer to any one of the unit decoder circuit within the set of unit decoder circuits and may refer to different unit decoder circuits in different instances. Then the algorithm proceeds to 322, where the decoded codeword is moved from the unit decoder circuit i to a respective unit output buffer circuit within an output buffer circuit (e.g., the output buffer circuit 206 in FIG. 2). At 324, the decoding is complete and the unit decoder circuit i is moved to power down mode, and the algorithm repeats itself from 302.

If no at 306, the algorithm proceeds to 310, where a determination whether a unit decoder circuit within the set of unit decoder circuits is decoding a codeword with a lower quality-of-service (QoS) class (say, codeword N) than the incoming codeword. In some embodiments, each input channel (or the codewords associated therewith) is assigned a predefined QoS class. If yes at 310, the algorithm proceeds to 312, where the decoding of the codeword N at the unit decoder circuit i is stopped, in order to make the unit decoder circuit i available for the incoming codeword. In some embodiments, once the decoding of the codeword N is stopped, the codeword N may be released (e.g., released in error) to the respective unit output buffer circuit or the codeword N may be completely dropped, potentially depending on the associated QoS class of the codeword N. At 314, the incoming codeword is distributed to the unit decoder circuit i with the lower QoS class codeword. Then the algorithm proceeds to 322, where the decoded codeword is moved from the unit decoder circuit i to the respective unit output buffer circuit within the output buffer circuit (e.g., the output buffer circuit 206 in FIG. 2). At 324, the decoding is complete and the unit decoder circuit i is moved to power down mode, and the algorithm repeats itself from 302.

If no at 310, the algorithm proceeds to 316, where a determination whether a unit decoder circuit within the set of unit decoder circuits has reached a maximum delay allowed for a codeword (say, codeword M) the unit decoder circuit is currently processing. In some embodiments, each channel is assigned a maximum delay (e.g., max_delay(n)) for processing the codewords associated therewith. If yes at 316, the algorithm proceeds to 318, where the decoding of the codeword M at the unit decoder circuit i that has reached the maximum delay is stopped, in order to make the unit decoder circuit i available for the incoming codeword. In some embodiments, once the decoding of the codeword M is stopped, the codeword M may be released (e.g., released in error) from the unit decoder circuit i to the respective unit output buffer circuit or the codeword M may be completely dropped, potentially depending on the associated QoS class of the codeword M. At 320, the incoming codeword is distributed to the unit decoder circuit i with the maximum delay reached. Then the algorithm proceeds to 322, where the decoded codeword is moved from the unit decoder circuit i to the respective unit output buffer circuit within the output buffer circuit (e.g., the output buffer circuit 206 in FIG. 2). At 324, the decoding is complete and the unit decoder circuit i is moved to power down mode, and the algorithm repeats itself from 302. If no at 316, the algorithm proceeds to 326, where the incoming codeword is discarded or forwarded directly to the respective unit output buffer circuit within the output buffer circuit without decoding and the algorithm proceeds to 302. In some embodiments, the incoming codeword is discarded after a predefined time interval (e.g., when the next incoming codeword arrives at the corresponding unit input buffer circuit).

Figure 4A:
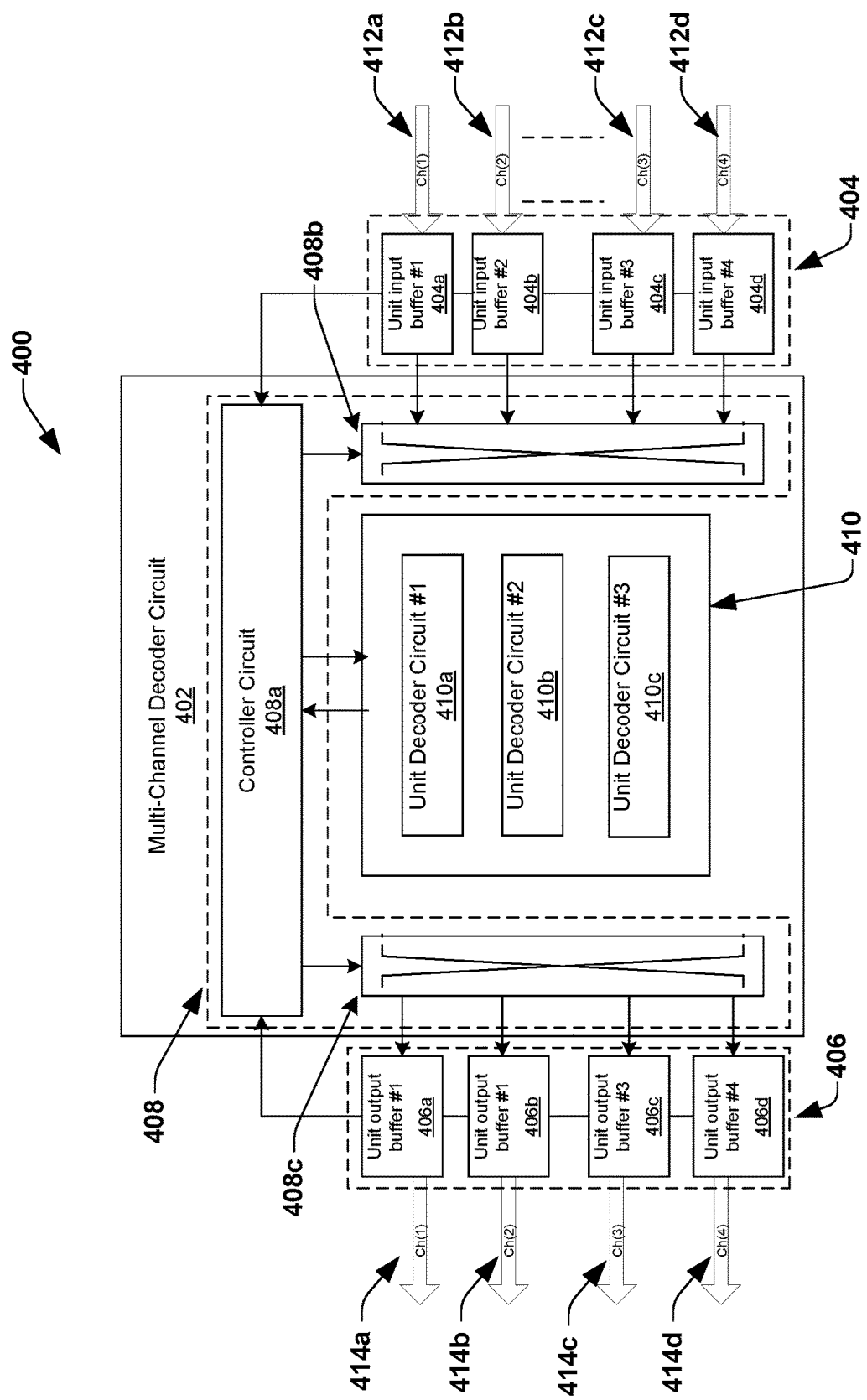
FIG. 4a illustrates an example implementation of a multi-channel decoder system, according to one embodiment of the disclosure.

FIG. 4a illustrates an example implementation of a multi-channel decoder system 400, according to one embodiment of the disclosure. In some embodiments, the multi-channel decoder system 400 may be included within multi-channel receivers associated with any communication systems. In some embodiments, the multi-channel decoder system 400 comprises one possible way of implementation of the multi-channel decoder system 200 in FIG. 2. Therefore, all the features applicable to the multi-channel decoder system 200 are also applicable to the multi-channel decoder system 400. The multi-channel decoder system 400 comprises a multi-channel decoder circuit 402, an input buffer circuit 404 and an output buffer circuit 406. The input buffer circuit 404 comprises four unit input buffer circuits 404a, 404b, 404c and 404d configured to store incoming codewords respectively associated with four input channels 412a, 412b, 412c and 412d. However, in other embodiments, the input buffer circuit 404 may comprise more or less than four unit input buffer circuits configured to receive incoming codewords associated with a respective number of input channels.

The multi-channel decoder circuit 402 comprises a distributed decoder circuit 410 and a distribution controller circuit 408. The distributed decoder circuit 410 comprises three unit decoder circuits 410a, 410b and 410c. However, in other embodiments, the distributed decoder circuit 410 may comprise more or less than three unit decoder circuits. In some embodiments, each of the unit decoder circuits 410a, 410b and 410c is configured to receive one or more codewords of a plurality of codewords associated with the plurality of input channels 412a, 412b, 412c and 412d, and decode the one or more codewords. In particular, each unit decoder circuit of the set of unit decoder circuits 410a, 410b and 410c may be configured to receive one or more codewords of a plurality of codewords associated with the input channels 412a, 412b, 412c and 412d from the unit input buffer circuits 404a, 404b, 404c and 404d within the input buffer circuit 404. In some embodiments, the distribution controller circuit 408 may be configured to distribute each incoming codeword of the one or more codewords to the respective unit decoder circuit of the set of unit decoder circuits 410a, 410b and 410c, based on determining a currently available unit decoder circuit within the set of unit decoder circuits 410a, 410b and 410c. In some embodiments, the distribution controller circuit 408 may be configured to distribute each incoming codeword of the one or more codewords to the respective unit decoder circuit of the set of unit decoder circuits 410a, 410b and 410c, in accordance with the predefined distribution control algorithm 300 above.

The distribution controller circuit 408 comprises a controller circuit 408a, an input distribution network circuit 408b and an output distribution network circuit 408c. In some embodiments, the controller circuit 408a is configured to identify an arrival of each incoming codeword of the plurality of codewords associated with the plurality of input channels and determine a currently available unit decoder circuit within the unit decoder circuits 410a, 410b and 410c, in order to distribute each of the respective incoming codeword. In some embodiments, identifying an arrival of an incoming codeword of the plurality of codewords associated with the plurality of input channels comprises identifying an arrival of the incoming codeword of the plurality of codewords within the input buffer circuit 404. Upon determining a currently available unit decoder circuit, the controller circuit 408a is further configured to provide instructions to the input distribution network circuit 408b to distribute the incoming codeword to the currently available unit decoder circuit.

In some embodiments, the input distribution network circuit 408b is coupled to the controller circuit 408a and is configured to distribute the incoming codeword to the respective unit decoder circuit (i.e., the currently available decoder circuit), based on instructions from the controller circuit 408a. In some embodiments, the output distribution network circuit 408c is configured to distribute decoded codewords from the unit decoder circuits to respective output channels 414a, 414b, 414c and 414d, based on instructions from the controller circuit 408a. In some embodiments, the output buffer circuit 406 is coupled to the output distribution network circuit 408c and is configured to receive and store the decoded codewords from the three unit decoder circuits 410a, 410b and 410c. The output buffer circuit 406 comprises four unit output buffer circuits 406a, 406b, 406c and 406d respectively associated with the output channels 414a, 414b, 414c and 414d. In such embodiments, the controller circuit 408a is further configured to determine a respective unit output buffer circuit to which a decoded codeword at the output of the distributed decoder circuit 410 needs to be distributed and provide instructions to the output distribution network circuit 408c based thereon.

Figure 4B:
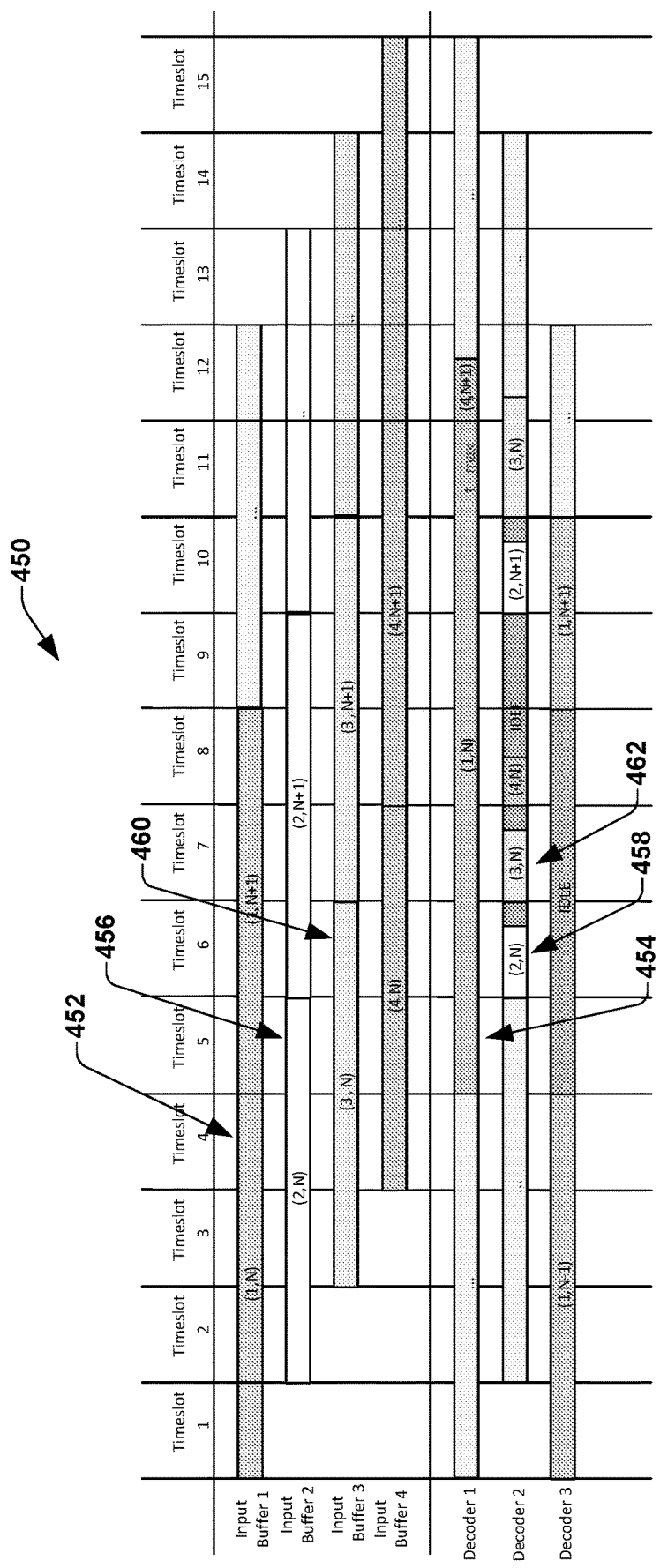
FIG. 4b illustrates a graph depicting the distributed scheduling of the multi-channel decoder system of FIG. 4a, according to one embodiment of the disclosure.

FIG. 4b illustrates a graph 450 depicting the distributed scheduling of the multi-channel decoder system 400, according to one embodiment of the disclosure. In this embodiment, the codewords are shown to arrive at the different channels (or input buffers associated therewith) one after the other. However, in other embodiments, the codewords may be configured to arrive at the different channels (or input buffers associated therewith) simultaneously. At 452 (i.e., timeslot 4), a receipt of an incoming codeword (1, N) is completed at the input buffer 1 (e.g., the unit input buffer circuit 404a in FIG. 4a). At 454 (i.e., timeslot 5), the codeword (1, N) is distributed to the decoder 1 (e.g., the unit decoder circuit 410a in FIG. 4a) by the distribution controller circuit 408, based on determining a currently available unit decoder circuit. In some embodiments, a currently available decoder circuit is determined at the distribution controller circuit 408 in accordance with the distribution control algorithm 300 in FIG. 3 above. At 456 (i.e., timeslot 5), a receipt of an incoming codeword (2, N) is completed at the input buffer 2 (e.g., the unit input buffer circuit 404b in FIG. 4a). At 458 (i.e., timeslot 6), the codeword (2, N) is distributed to the decoder 2 (e.g., the unit decoder circuit 410b in FIG. 4a) by the distribution controller circuit 408, based on determining a currently available unit decoder circuit.

At 460 (i.e., timeslot 6), a receipt of an incoming codeword (3, N) is completed at the input buffer 3 (e.g., the unit input buffer circuit 404c in FIG. 4a). At 462 (i.e., timeslot 7), the codeword (3, N) is distributed to the decoder 2 (e.g., the unit decoder circuit 410b in FIG. 4a) by the distribution controller circuit 408, based on determining a currently available unit decoder circuit. At 462, it may be noted that the decoder 2 is free/idle after finishing the decoding of the codeword (2,N). However, in other embodiments, the distribution controller circuit 408 may be configured to distribute the codeword (3,N) to decoder 3 instead of decoder 2, which is also free during timeslot 7, as can be seen in the graph 450. The distribution of codewords depicted in the graph 450 is just one possible way in which incoming codewords may be distributed between the unit decoder circuits by the distribution controller circuit 408 and is not to be construed to be limited. In other embodiments, however, the incoming codewords may be distributed differently, based on determining currently available unit decoder circuits.

Figure 5:
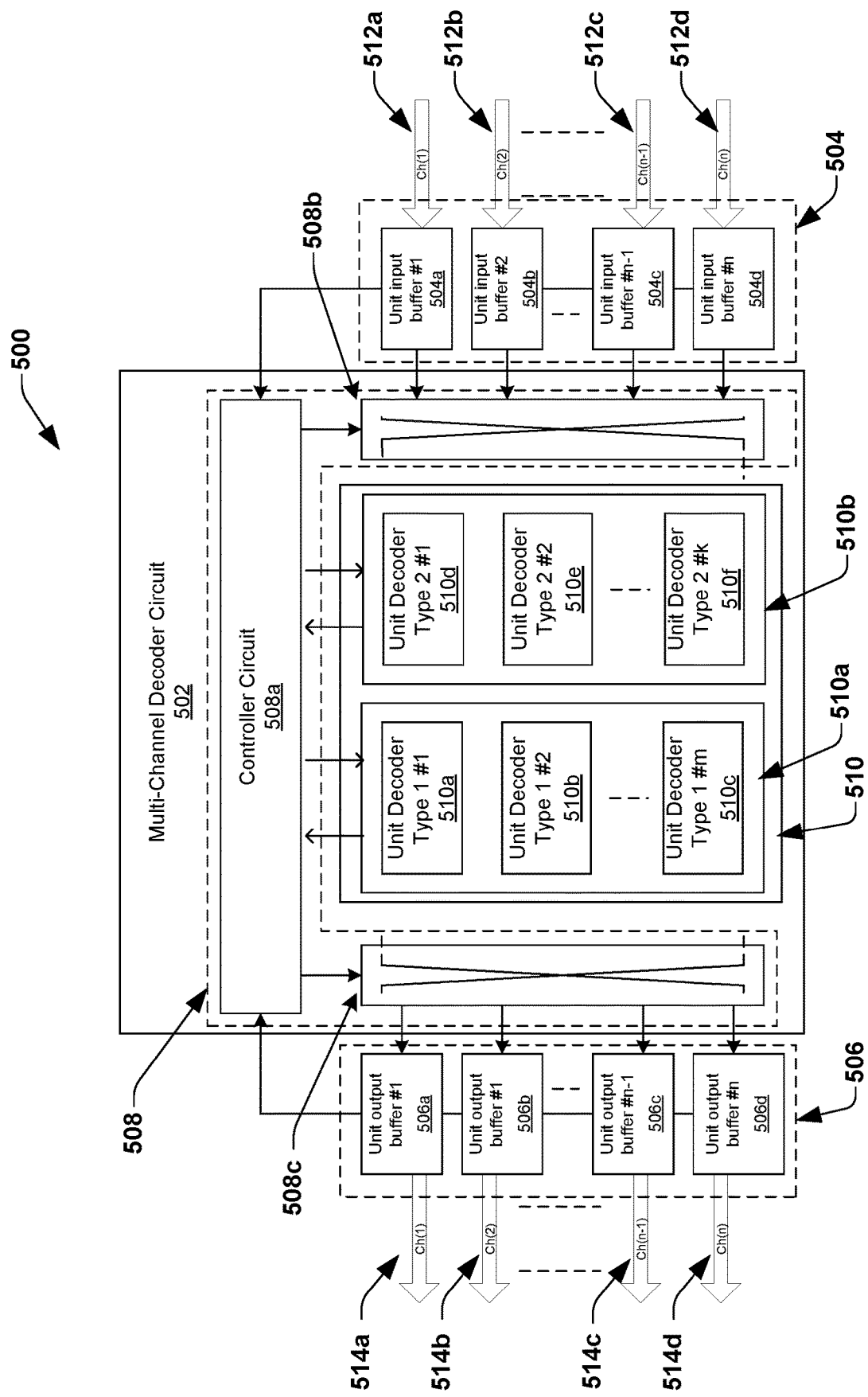
FIG. 5 illustrates an example implementation of a multi-channel decoder system, according to one embodiment of the disclosure.

FIG. 5 illustrates an example implementation of a multi-channel decoder system 500, according to one embodiment of the disclosure. In some embodiments, the multi-channel decoder system 500 may be included within multi-channel receivers associated with any communication systems, for example, passive optical network (PON) systems, digital subscriber line (xDSL) systems etc. In some embodiments, the multi-channel decoder system 500 comprises another possible way of implementation of the multi-channel decoder system 100 in FIG. 1. The multi-channel decoder system 500 comprises a multi-channel decoder circuit 502, an input buffer circuit 504 and an output buffer circuit 506. The input buffer circuit 504 comprises a plurality of unit input buffer circuits 504a, 504b etc. configured to store incoming codewords respectively associated with a plurality of input channels 512a, 512b etc.

In some embodiments, the multi-channel decoder circuit 502 comprises a distributed decoder circuit 510 and a distribution controller circuit 508. In some embodiments, the distributed decoder circuit 510 comprises a set of unit decoder circuits 510a, 510b . . . 510f. In some embodiments, a number of unit decoder circuits within the set of unit decoder circuits 510a, 510b . . . 510f is less than a number of input channels within the plurality of input channels 512a, 512b etc. (or the plurality of unit buffer circuits associated therewith). However, in other embodiments, the number of unit decoder circuits within the set of unit decoder circuits 510a, 510b . . . 510f may be equal or greater than the number of input channels 512a, 512b etc. within the plurality of input channels (or the plurality of unit buffer circuits associated therewith). In some embodiments, the set of unit decoder circuits 510a, 510b . . . 510f are arranged into two or more decoder pool circuits, each decoder pool circuit comprising one or more unit decoder circuits with a predefined QoS class. In particular, in this example embodiment, the distributed decoder circuit 510 comprises a first decoder pool circuit 510A and a second decoder pool circuit 510B. In some embodiments, the first decoder pool circuit 510A comprises a plurality of unit decoder circuits 510a, 510b . . . 510c, each decoder circuit having a first predefined QoS class. Similarly, the second decoder pool circuit 510B comprises a plurality of unit decoder circuits 510d, 510e . . . 510f, each decoder circuit having a second predefined QoS class. In some embodiments, each of the first predefined QoS class and the second predefined QoS class may comprise an aggregation of one or more QoS classes and is not to be construed to be limited to a single QoS class.

In some embodiments, each unit decoder circuit within a decoder pool circuit (e.g., the first decoder pool circuit 510A or the second decoder pool circuit 510B) is configured to receive one or more codewords of a plurality of codewords associated with the plurality of input channels 512a, 512b etc. having a same QoS class associated with the respective decoder pool circuit, and decode the one or more codewords. In some embodiments, the distribution controller circuit 508 may be configured to distribute each incoming codeword of the one or more codewords to the respective unit decoder circuit with the respective decoder pool circuit (e.g., the first decoder pool circuit 510A or the second decoder pool circuit 510B), based on determining the QoS class of the incoming codeword and based on determining a currently available unit decoder circuit within the decoder pool circuit having the same QoS class as the incoming codeword. In some embodiments, the distribution controller circuit 508 may be configured to distribute the incoming codeword of the plurality of codewords to the respective unit decoder circuit within a select decoder pool circuit (e.g., the first decoder pool circuit 510A or the second decoder pool circuit 510B), in accordance with the predefined distribution control algorithm 300 above.

In some embodiments, the distribution controller circuit 508 comprises a controller circuit 508a, an input distribution network circuit 508b and an output distribution network circuit 508c. In some embodiments, the controller circuit 508a is configured to identify an arrival of each incoming codeword of the plurality of codewords associated with the plurality of input channels and determine the QoS class of the incoming codeword. Upon determining the QoS class of the incoming codeword, the controller circuit 508a is further configured to determine a currently available unit decoder circuit within the set of unit decoder circuits associated with a select decoder pool circuit having the same QoS class as the incoming codeword (in accordance with the predefined distribution control algorithm), in order to distribute each of the respective codeword. In some embodiments, identifying an arrival of each codeword of the plurality of codewords associated with the plurality of input channels comprises identifying an arrival of each codeword of the plurality of codewords within the input buffer circuit 504.

In some embodiments, the input distribution network circuit 508b is coupled to the controller circuit 508a and is configured to distribute each incoming codeword of the plurality of codewords associated with the plurality of input channels to respective unit decoder circuits (i.e., a currently available decoder circuit), based on instructions from the controller circuit 508a. In some embodiments, the output distribution network circuit 508c is configured to distribute the decoded codewords from the set of unit decoder circuits 510a, 510b . . . 510f associated with the first decoder pool circuit 510A and the second decoder pool circuit 510B to a plurality of respective output channels 514a, 514b etc., based on instructions from the controller circuit 508a. In some embodiments, the output buffer circuit 506 is coupled to the output distribution network circuit 508c and is configured to receive and store the decoded codewords from the set of unit decoder circuits 510a, 510b . . . 510f. In some embodiments, the output buffer circuit 506 comprises a plurality of unit output buffer circuits 506a, 506b etc. respectively associated with the plurality of output channels 514a, 514b etc. In such embodiments, the controller circuit 508a is further configured to determine a respective unit output buffer circuit to which a decoded codeword at the output of the distributed decoder circuit 510 needs to be distributed and provide instructions to the output distribution network circuit 508c based thereon.

Figure 6:
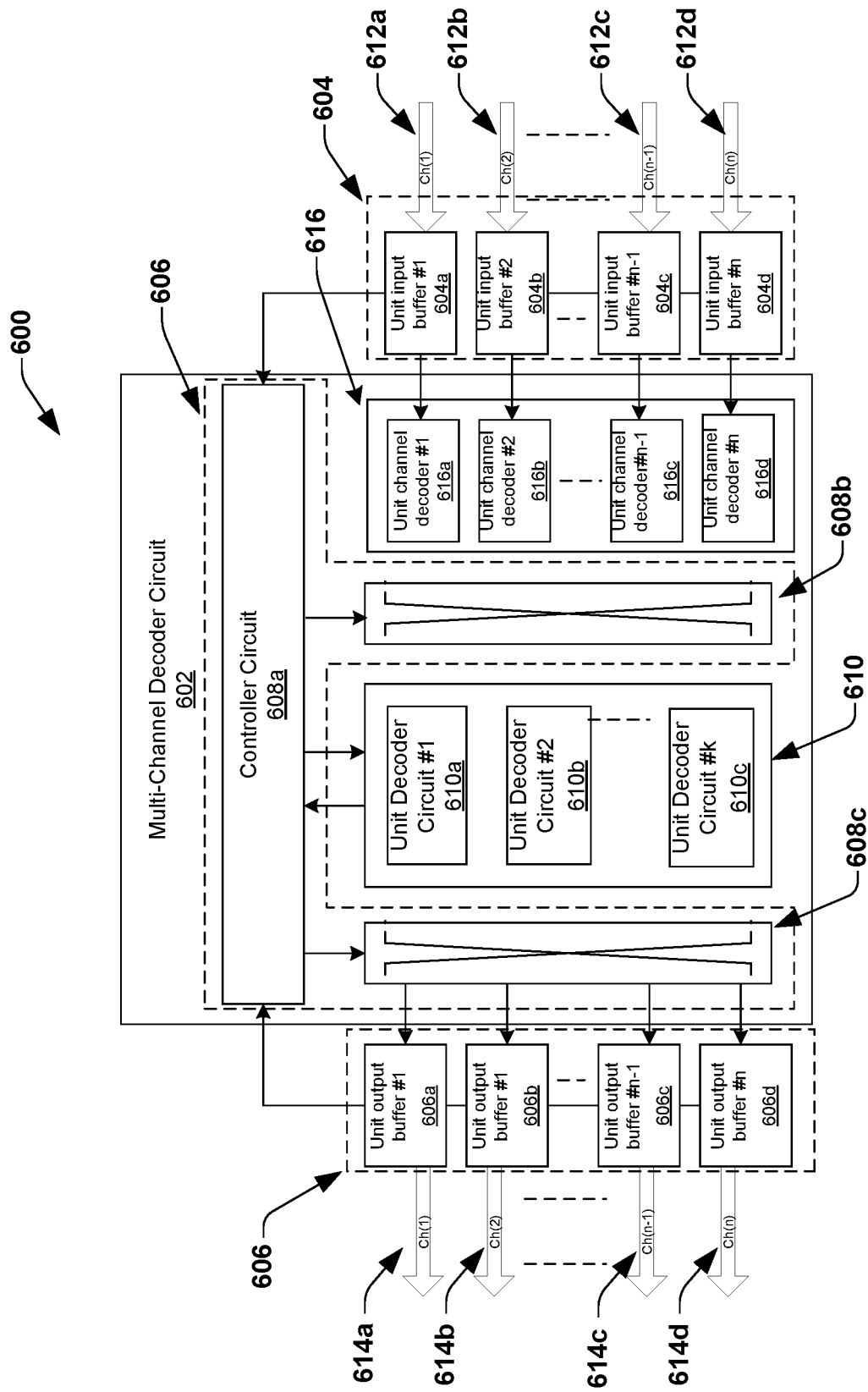
FIG. 6 illustrates an example implementation of a multi-channel decoder system, according to one embodiment of the disclosure.

FIG. 6 illustrates an example implementation of a multi-channel decoder system 600, according to one embodiment of the disclosure. In some embodiments, the multi-channel decoder system 600 may be included within multi-channel receivers associated with any communication systems, for example, passive optical network (PON) systems, digital subscriber line (xDSL) systems etc. In some embodiments, the multi-channel decoder system 600 comprises another possible way of implementation of the multi-channel decoder system 100 in FIG. 1, and therefore all the features applicable to the multi-channel decoder system 100 is also applicable to the multi-channel decoder system 600. The multi-channel decoder system 600 comprises a multi-channel decoder circuit 602, an input buffer circuit 604 and an output buffer circuit 606. The input buffer circuit 604 comprises a plurality of unit input buffer circuits 604a, 604b etc. configured to store incoming codewords respectively associated with a plurality of input channels 612a, 612b etc. The multi-channel decoder circuit 602 comprises a dedicated decoder circuit 616, a distributed decoder circuit 610 and a distribution controller circuit 608. In some embodiments, the dedicated decoder circuit 616 may comprise a slim and fast low-density parity-check (LDPC) decoder stage (e.g., an LDPC decoder with bit-flip algorithm (BFA)), and the distributed decoder circuit 610 may comprise a potentially slower LDPC decoder (e.g., an LDPC decoder with min-sum algorithm (MSA) or sum-product algorithm (SPA). However, in other embodiments, the dedicated decoder circuit 616 and the distributed decoder circuit 610 may be implemented differently. In some embodiments, a final bit error rate (BER) target may not be achieved by the dedicated decoder circuit 616 alone.

In some embodiments, the dedicated decoder circuit 616 comprises a plurality of unit channel decoder circuits 616a, 616b etc. respectively associated with the plurality of input channels 612a, 612b etc. In some embodiments, each of the plurality of unit channel decoder circuits is configured to process/decode codewords associated with a respective input channel of the plurality of input channels, thereby providing a plurality of processed codewords. In some embodiments, the processed codewords comprises decoded codewords. In some embodiments, each of the plurality of unit channel decoder circuits 616a, 616b etc. is respectively coupled to the unit input buffer circuits 604a, 604b etc. and process the codewords stored within the unit input buffer circuits 604a, 604b etc. In some embodiments, the distributed decoder circuit 610 comprises a set of unit decoder circuits 610a, 610b . . . 610c. In some embodiments, a number of unit decoder circuits #k within the set of unit decoder circuits 610a, 610b etc. is less than a number #n of unit channel decoder circuits 616a, 616b etc. within the dedicated decoder circuit 616. However, in other embodiments, the number of unit decoder circuits #k within the set of unit decoder circuits 610a, 610b etc. may be equal or greater than the number #n of unit channel decoder circuits 616a, 616b etc. within the dedicated decoder circuit 616. In some embodiments, each unit decoder circuit of the set of unit decoder circuits 610a, 610b etc. is configured to receive one or more codewords of a plurality of codewords associated with the plurality of input channels 612a, 612b etc. and decode the one or more codewords. In particular, each unit decoder circuit of the set of unit decoder circuits 610a, 610b etc. may be configured to receive one or more processed codewords of the plurality of processed codewords from the plurality of unit channel decoder circuits 616a, 616b etc. associated with the dedicated decoder circuit 616.

In some embodiments, the distribution controller circuit 608 may be configured to distribute each codeword of the one or more processed codewords to the respective unit decoder circuit of the set of unit decoder circuits 610a, 610b etc., based on determining a currently available unit decoder circuit within the set of unit decoder circuits 610a, 610b etc. In some embodiments, the distribution controller circuit 608 may be configured to distribute each codeword of the one or more processed codewords to the respective unit decoder circuit of the set of unit decoder circuits 610a, 610b etc. in accordance with the predefined distribution control algorithm 300 above. In some embodiments, the distribution controller circuit 608 comprises a controller circuit 608a, an input distribution network circuit 608b and an output distribution network circuit 608c. In some embodiments, the controller circuit 608a is configured to identify an arrival of each codeword of the plurality of codewords associated with the plurality of input channels and determine a currently available unit decoder circuit within the set of unit decoder circuits 610a, 610b etc., in order to distribute each of the respective codeword. In some embodiments, identifying an arrival of each codeword of the plurality of codewords associated with the plurality of input channels comprises identifying an arrival of each processed codeword of the plurality of processed codewords at the output of the dedicated decoder circuit 616. In some embodiments, when multiple processed codewords respectively associated with multiple different input channels arrive simultaneously at the output of the dedicated decoder circuit 616, the controller circuit 608 may be configured to distribute each processed codeword of the multiple processed codewords in a predefined order in accordance with some predefined condition, for example, based on the quality-of-service class of the processed codewords. For example, the controller circuit 608a may be configured to schedule the distribution of a processed codeword with higher QoS class first, followed by a processed codeword with a lesser QoS class. However, in other embodiments, the multiple processed codewords may be scheduled to be distributed differently than above.

In some embodiments, the input distribution network circuit 608b is coupled to the controller circuit 608a and is configured to distribute each processed codeword of the plurality of processed codewords associated with the dedicated decoder circuit 616 to respective unit decoder circuits (i.e., a currently available decoder circuit), based on instructions from the controller circuit 608a. In some embodiments, the output distribution network circuit 608c is configured to distribute decoded codewords from the set of unit decoder circuits to a plurality of respective output channels 614a, 614b etc., based on instructions from the controller circuit 608a. In some embodiments, the output buffer circuit 606 is coupled to the output distribution network circuit 608c and configured to receive and store the decoded codewords from the set of unit decoder circuits 610a, 610b etc. In some embodiments, the output buffer circuit 606 comprises a plurality of unit output buffer circuits 606a, 606b etc. respectively associated with the plurality of output channels 614a, 614b etc. In such embodiments, the controller circuit 608a is further configured to determine a respective unit output buffer circuit to which a decoded codeword at the output of the distributed decoder circuit 610 needs to be distributed and provide instructions to the output distribution network circuit 608c based thereon.

Figure 7:
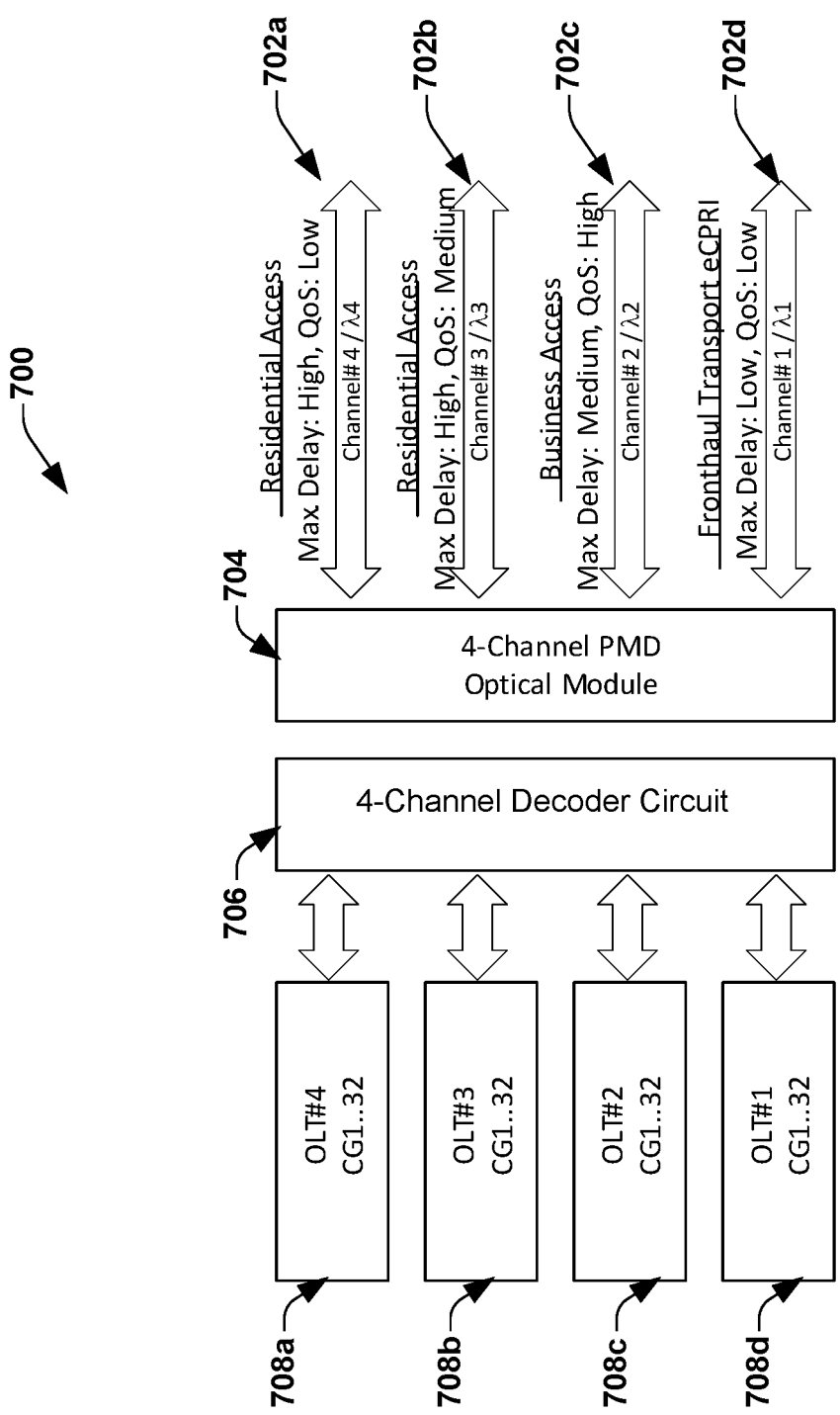
FIG. 7 illustrates a passive optical network (PON) system, according to one embodiment of the disclosure.

FIG. 7 illustrates a passive optical network (PON) system 700, according to one embodiment of the disclosure. The PON system 700 comprises a 4-channel decoder circuit 706 configured to received codewords respectively associated with four input channels 702a, 702b, 702c and 702d. In some embodiments, each of the four input channels 702a, 702b, 702c and 702d are mapped to different quality-of-service classes, and therefore, the codewords associated with the respective input channels have the respective QoS class associated therewith. In other embodiments, an input channel (e.g., the input channel 702a) may comprise different, multiplexed payload sources that are assigned to different quality-of-service classes. In such a case the input channel may be configured to convey additional information for the controller circuit that allows assignment of each codeword to the appropriate quality-of-service classes. In some embodiments, the 4-channel decoder circuit may be implemented as the multi-channel decoder system 200 or the multi-channel decoder system 500 or the multi-channel decoder system 600 as explained above. In some embodiments, the PON system 700 further comprises a 4-channel physical medium dependent (PMD) optical module comprising electronic circuits configured to convert optical signals associated with the input channels to electrical signals. In some embodiments, the PON system 700 further comprises optical line terminal (OLT) 708a, 708b, 708c and 708d, configured to receive decoded codewords associated with each of the respective input channels 702a, 702b, 702c and 702d from the 4-channel decoder circuit 706.

Figure 8:
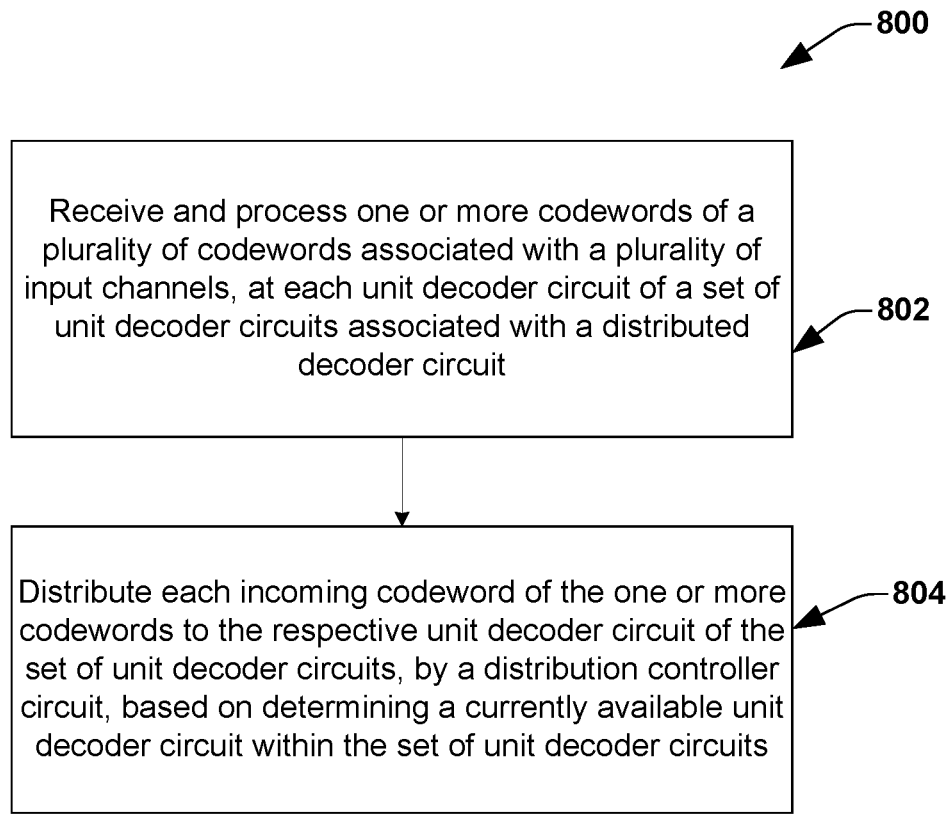
FIG. 8 illustrates a flowchart of a method for a multi-channel decoder circuit, according to one embodiment of the disclosure.

FIG. 8 illustrates a flowchart of a method 800 for a multi-channel decoder circuit, according to one embodiment of the disclosure. The method 800 is explained herein with reference to the multi-channel decoder circuit 202 in FIG. 2. However, the method 800 is equally applicable to the multi-channel decoder circuit 102 in FIG. 1, the multi-channel decoder circuit 402 in FIG. 4a, the multi-channel decoder circuit 502 in FIG. 5 and the multi-channel decoder circuit 602 in FIG. 6. At 802, one or more codewords of a plurality of codewords associated with a plurality of input channels (e.g., the input channels 212a, 212b etc. in FIG. 2) are received and processed, at each unit decoder circuits of a set of unit decoder circuits (e.g., the set of unit decoder circuits 210a, 210b etc. in FIG. 2) associated with a distributed decoder circuit (e.g., the distributed decoder circuit 210 in FIG. 2). In some embodiments, a number of unit decoder circuits within the set of unit decoder circuits is less than a number of input channels within the plurality of input channels. However, in other embodiments, the number of unit decoder circuits within the set of unit decoder circuits may be equal or greater than the number of input channels within the plurality of input channels.

At 804, each incoming codeword of the one or more codewords are distributed to the respective unit decoder circuit of the set of unit decoder circuits, by a distribution controller circuit (e.g., the distribution controller circuit 208 in FIG. 2), based on determining a currently available unit decoder circuit within the set of unit decoder circuits. In some embodiments, the distribution controller circuit may be configured to determine a currently available unit decoder circuit based on the distribution control algorithm 300 above. In some embodiments, determining a currently available unit decoder circuit within the set of unit decoder circuits associated with the distributed decoder circuit comprises determining a unit decoder circuit within the set of unit decoder circuits that is free to decode the incoming codeword. In some embodiments, determining a currently available unit decoder circuit within the set of unit decoder circuits comprises determining a unit decoder circuit within the set of unit decoder circuits that is decoding a codeword that has a lower quality-of-service (QoS) class than the incoming codeword; and stopping the decoding of the codeword with the lower QoS class, in order to make the unit decoder circuit available for the incoming codeword. In some embodiments, determining a currently available unit decoder circuit within the set of unit decoder circuits comprises determining a unit decoder circuit within the set of unit decoder circuits that has exceeded the maximum delay assigned for processing the current codeword that the unit decoder circuit is processing; and stopping the decoding of the current codeword, in order to make the unit decoder circuit available for the incoming codeword.

In some embodiments, the distribution controller circuit may comprise a controller circuit (e.g., the controller circuit 208a in FIG. 2), an input distribution network circuit (e.g., the input distribution network circuit 208b in FIG. 2) and an output distribution network circuit (e.g., the output distribution network circuit 208c in FIG. 2). In some embodiments, the controller circuit may be configured to identify an arrival of each incoming codeword of the plurality of codewords associated with the plurality of input channels and determine a currently available unit decoder circuit within the set of unit decoder circuits, in order to distribute each of the respective incoming codeword. In some embodiments, identifying an arrival of each incoming codeword of the plurality of codewords associated with the plurality of input channels comprises identifying an arrival of each incoming codeword of the plurality of codewords within an input buffer circuit (e.g., the input buffer circuit 204 in FIG. 2) coupled to the controller circuit. In some embodiments, the input distribution network circuit is coupled to the controller circuit and is configured to distribute each incoming codeword of the plurality of codewords associated with the plurality of input channels to the respective unit decoder circuit (i.e., the currently available decoder circuit), based on instructions from the controller circuit. In some embodiments, the output distribution network circuit may be configured to distribute decoded codewords from the set of unit decoder circuits associated with the distributed decoder circuit to a plurality of respective output channels (e.g., the plurality of respective output channels 214a, 214b etc.), based on instructions from the controller circuit. In some embodiments, the output distribution network circuit may be configured to distribute decoded codewords from the set of unit decoder circuits associated with the distributed decoder circuit to a plurality of unit output buffer circuits (e.g., the plurality of unit output buffer circuits 206a, 206b etc.), respectively associated with the plurality of output channels.

In some embodiments, the set of unit decoder circuits within the distributed decoder circuit may be arranged into two or more decoder pool circuits (e.g., the first decoder pool circuit 510A and the second decoder pool circuit 510B in FIG. 5), each decoder pool circuit comprising one or more unit decoder circuits with a predefined QoS class. In such embodiments, the distribution controller circuit may be configured to distribute each incoming codeword of the one or more codewords to the respective unit decoder circuit, based on determining the QoS class of the incoming codeword and based on determining a currently available unit decoder circuit within a decoder pool circuit with the corresponding QoS class. In some embodiments, the multi-channel decoder circuit further comprises a dedicated decoder circuit coupled to the distribution controller circuit, and configured to process the plurality of codewords associated with the plurality of input channels, thereby forming a plurality of processed codewords, prior to providing the plurality of codewords to the distribution controller circuit. In such embodiments, distribution controller circuit may be configured to distribute the processed codewords to the set of unit decoder circuits within the distributed decoder circuit.

While the methods/algorithms are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a multi-channel decoder circuit, comprising a distributed decoder circuit comprising a set of unit decoder circuits, each unit decoder circuit configured to receive one or more codewords of a plurality of codewords associated with a plurality of input channels, and decode the one or more codewords; and a distribution controller circuit configured to distribute each incoming codeword of the one or more codewords to the respective unit decoder circuit of the set of unit decoder circuits within the distributed decoder circuit, based on determining a currently available unit decoder circuit within the set of unit decoder circuits.

Example 2 is a multi-channel decoder circuit, including the subject matter of example 1, wherein the distribution controller circuit comprises a controller circuit configured to identify an arrival of each incoming codeword of the plurality of codewords associated with the plurality of input channels; and determine a currently available unit decoder circuit within the set of unit decoder circuits, in order to distribute each of the respective incoming codeword.

Example 3 is a multi-channel decoder circuit, including the subject matter of examples 1-2, including or omitting elements, wherein the distribution controller circuit further comprises an input distribution network circuit configured to distribute each incoming codeword of the plurality of codewords associated with a plurality of input channels to a respective unit decoder circuit, based on instructions from the controller circuit; and an output distribution network circuit configured to distribute decoded codewords from the set of unit decoder circuits to a plurality of output channels associated therewith, based on instructions from the controller circuit.

Example 4 is a multi-channel decoder circuit, including the subject matter of examples 1-3, including or omitting elements, wherein determining a currently available unit decoder circuit within the set of unit decoder circuits comprises determining a unit decoder circuit within the set of unit decoder circuits that is free to decode the incoming codeword.

Example 5 is a multi-channel decoder circuit, including the subject matter of examples 1-4, including or omitting elements, wherein determining a currently available unit decoder circuit within the set of unit decoder circuits comprises determining a unit decoder circuit within the set of unit decoder circuits that is decoding a codeword that has a lower quality-of-service (QoS) class than the incoming codeword; and stopping the decoding of the codeword with the lower QoS class, in order to make the unit decoder circuit available for the incoming codeword.

Example 6 is a multi-channel decoder circuit, including the subject matter of examples 1-5, including or omitting elements, wherein determining a currently available unit decoder circuit within the set of unit decoder circuits comprises determining a unit decoder circuit within the set of unit decoder circuits that has exceeded the maximum delay assigned for processing the current codeword that the unit decoder circuit is processing; and stopping the decoding of the current codeword, in order to make the unit decoder circuit available for the incoming codeword.

Example 7 is a multi-channel decoder circuit, including the subject matter of examples 1-6, including or omitting elements, wherein the set of unit decoder circuits are arranged into two or more decoder pool circuits, each decoder pool circuit comprising one or more unit decoder circuits with a predefined QoS class.

Example 8 is a multi-channel decoder circuit, including the subject matter of examples 1-7, including or omitting elements, wherein the distribution controller circuit is configured to distribute each incoming codeword of the one or more codewords to the respective unit decoder circuit, based on determining the QoS class of the incoming codeword and based on determining a currently available unit decoder circuit within a decoder pool circuit with the corresponding QoS class.

Example 9 is a multi-channel decoder circuit, including the subject matter of examples 1-8, including or omitting elements, further comprising a dedicated decoder circuit coupled to the distribution controller circuit, and configured to process the plurality of codewords associated with the plurality of input channels, prior to providing the plurality of codewords to the distribution controller circuit, wherein the dedicated decoder circuit comprises a plurality of unit channel decoder circuits respectively associated with the plurality of input channels, wherein each of the plurality of unit channel decoder circuits is configured to process codewords associated with a respective input channel of the plurality of input channels, thereby providing a plurality of processed codewords.

Example 10 is a multi-channel decoder circuit, including the subject matter of examples 1-9, including or omitting elements, wherein a number of unit decoder circuits within the set of unit decoder circuits is less than a number of input channels within the plurality of input channels.

Example 11 is a multi-channel decoder circuit, including the subject matter of examples 1-10, including or omitting elements, wherein the multi-channel decoder circuit is associated with digital subscriber line (xDSL) systems.

Example 12 is a multi-channel decoder system, comprising a multi-channel decoder circuit comprising a distributed decoder circuit comprising a set of unit decoder circuits, each unit decoder circuit configured to receive one or more codewords of a plurality of codewords associated with a plurality of input channels, and decode the one or more codewords; and a distribution controller circuit configured to distribute each incoming codeword of the one or more codewords to the respective unit decoder circuit of the set of unit decoder circuits, based on determining a currently available unit decoder circuit within the set of unit decoder circuits.

Example 13 is a multi-channel decoder system, including the subject matter of example 12, wherein the distribution controller circuit comprises a controller circuit configured to identify an arrival of each incoming codeword of the plurality of codewords associated with the plurality of input channels; and determine a currently available unit decoder circuit within the set of unit decoder circuits, in order to distribute each of the respective incoming codeword.

Example 14 is a multi-channel decoder system, including the subject matter of examples 12-13, including or omitting elements, wherein the distribution controller circuit further comprises an input distribution network circuit configured to distribute each incoming codeword of the plurality of codewords associated with the plurality of input channels to a respective unit decoder circuit, based on instructions from the controller circuit; and an output distribution network circuit configured to distribute decoded codewords from the set of unit decoder circuits to a respective plurality of output channels associated therewith.

Example 15 is a multi-channel decoder system, including the subject matter of examples 12-14, including or omitting elements, further comprising an input buffer circuit comprising a plurality of unit input buffer circuits configured to store incoming codewords respectively associated with the plurality of input channels and wherein the input distribution network circuit is coupled to the input buffer circuit, in order to distribute each incoming codeword of the plurality of codewords associated with the plurality of input channels to the respective unit decoder circuits.

Example 16 is a multi-channel decoder system, including the subject matter of examples 12-15, including or omitting elements, further comprising an output buffer circuit comprising a plurality of unit output buffer circuits respectively associated with the plurality of output channels associated therewith, wherein the output buffer circuit is coupled to the output distribution network circuit and wherein each of the unit output buffer circuit within the output buffer circuit is configured to store decoded codewords associated with the respective output channel.

Example 17 is a multi-channel decoder system, including the subject matter of examples 12-16, including or omitting elements, wherein the set of unit decoder circuits are arranged into two or more decoder pool circuits, each decoder pool circuit comprising one or more unit decoder circuits with a predefined QoS class.

Example 18 is a multi-channel decoder system, including the subject matter of examples 12-17, including or omitting elements, wherein the distribution controller circuit is configured to distribute each incoming codeword of the one or more codewords to the respective unit decoder circuit, based on determining the QoS class of the incoming codeword and based on determining a currently available unit decoder circuit within a decoder pool circuit with the corresponding QoS class.

Example 19 is a multi-channel decoder system, including the subject matter of examples 12-18, including or omitting elements, wherein the multi-channel decoder circuit further comprises a dedicated decoder circuit coupled to the distribution controller circuit, and configured to process the plurality of codewords associated with the plurality of input channels, prior to providing the plurality of codewords to the distribution controller circuit, and wherein the dedicated decoder circuit comprises a plurality of unit channel decoder circuits respectively associated with the plurality of input channels, wherein each of the plurality of unit channel decoder circuits is configured to process codewords associated with a respective input channel of the plurality of input channels, thereby providing a plurality of processed codewords.

Example 20 is a multi-channel decoder system, including the subject matter of examples 12-19, including or omitting elements, wherein a number of unit decoder circuits within the set of unit decoder circuits is less than a number of input channels within the plurality of input channels.

Example 21 is a multi-channel decoder system, including the subject matter of examples 12-19, including or omitting elements, wherein the multi-channel decoder system is associated with digital subscriber line (xDSL) systems.

Example 22 is a method for a multi-channel decoder circuit, comprising receiving, at each unit decoder circuit of a set of unit decoder circuits associated with a distributed decoder circuit, one or more codewords of a plurality of codewords associated with a plurality of input channels, and processing the one or more codewords; and distributing each incoming codeword of the one or more codewords to the respective unit decoder circuit of the set of unit decoder circuits within the distributed decoder circuit, by a distribution controller circuit, based on determining a currently available unit decoder circuit within the set of unit decoder circuits.

Example 23 is a method, including the subject matter of example 22, wherein determining a currently available unit decoder circuit within the set of unit decoder circuits comprises determining a unit decoder circuit within the set of unit decoder circuits that is free to decode the incoming codeword.

Example 24 is a method, including the subject matter of examples 22-23, including or omitting elements, wherein determining a currently available unit decoder circuit within the set of unit decoder circuits comprises determining a unit decoder circuit within the set of unit decoder circuits that is decoding a codeword that has a lower quality-of-service (QoS) class than the incoming codeword; and stopping the decoding of the codeword with the lower QoS class, in order to make the unit decoder circuit available for the incoming codeword.

Example 25 is a method, including the subject matter of examples 22-24, including or omitting elements, wherein determining a currently available unit decoder circuit within the set of unit decoder circuits comprises determining a unit decoder circuit within the set of unit decoder circuits that has exceeded the maximum delay assigned for processing the current codeword that the unit decoder circuit is processing; and stopping the decoding of the current codeword, in order to make the unit decoder circuit available for the incoming codeword.

Example 26 is a method, including the subject matter of examples 22-25, including or omitting elements, wherein the set of unit decoder circuits are arranged into two or more decoder pool circuits, each decoder pool circuit comprising one or more unit decoder circuits with a predefined QoS class.

Example 27 is a method, including the subject matter of examples 22-26, including or omitting elements, wherein a number of unit decoder circuits within the set of unit decoder circuits is less than a number of input channels within the plurality of input channels.

Various illustrative logics, logical blocks, modules, and circuits described in connection with aspects disclosed herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A multi-channel decoder circuit, comprising:
    a distributed decoder circuit comprising a set of unit decoder circuits, each unit decoder circuit configured to receive one or more codewords of a plurality of codewords associated with a plurality of input channels, and iteratively decode the one or more codewords, a number of iterations being based on a latency target; and
    a distribution controller circuit configured to distribute an incoming codeword of the one or more codewords to the respective unit decoder circuit of the set of unit decoder circuits within the distributed decoder circuit, based on a predefined condition, the predefined condition relating to a quality-of-service (QoS) class of the incoming codeword, the plurality of codewords being distributed based on determining a currently available unit decoder circuit within the set of unit decoder circuits and based on the respective QoS class, a particular codeword being distributed specifically to the currently available unit decoder circuit based on a particular QoS class for the particular codeword.

2. The multi-channel decoder circuit of claim 1, wherein the distribution controller circuit comprises:
    a controller circuit configured to:
        identify an arrival of the incoming codeword of the plurality of codewords associated with the plurality of input channels; and
        determine the currently available unit decoder circuit within the set of unit decoder circuits, in order to distribute each of the respective incoming codeword.

3. The multi-channel decoder circuit of claim 2, wherein the distribution controller circuit further comprises:
    an input distribution network circuit configured to distribute the incoming codeword of the plurality of codewords associated with a plurality of input channels to a respective unit decoder circuit, based on instructions from the controller circuit; and
    an output distribution network circuit configured to distribute decoded codewords from the set of unit decoder circuits to a plurality of output channels associated therewith, based on instructions from the controller circuit.

4. The multi-channel decoder circuit of claim 1, wherein determining the currently available unit decoder circuit within the set of unit decoder circuits comprises determining a unit decoder circuit within the set of unit decoder circuits that is free to decode the incoming codeword.

5. The multi-channel decoder circuit of claim 1, wherein determining the currently available unit decoder circuit within the set of unit decoder circuits comprises:
    determining a unit decoder circuit within the set of unit decoder circuits that is decoding a codeword that has a lower QoS class than the incoming codeword; and
    stopping the decoding of the codeword with the lower QoS class, in order to make the unit decoder circuit available for the incoming codeword.

6. The multi-channel decoder circuit of claim 1, wherein determining the currently available unit decoder circuit within the set of unit decoder circuits comprises:
    determining a unit decoder circuit within the set of unit decoder circuits that has exceeded the maximum delay assigned for processing a current codeword that the unit decoder circuit is processing; and stopping the decoding of the current codeword, in order to make the unit decoder circuit available for the incoming codeword.

7. The multi-channel decoder circuit of claim 1, wherein the set of unit decoder circuits are arranged into two or more decoder pool circuits, each decoder pool circuit comprising one or more unit decoder circuits with a predefined QoS class.

8. The multi-channel decoder circuit of claim 7, wherein the distribution controller circuit is configured to distribute the incoming codeword of the one or more codewords to the respective unit decoder circuit, based on determining the QoS class of the incoming codeword and based on determining the currently available unit decoder circuit within a decoder pool circuit with a corresponding QoS class.

9. The multi-channel decoder circuit of claim 1, further comprising a dedicated decoder circuit coupled to the distribution controller circuit, and configured to process the plurality of codewords associated with the plurality of input channels, prior to providing the plurality of codewords to the distribution controller circuit, wherein the dedicated decoder circuit comprises a plurality of unit channel decoder circuits each associated with a respective input channel of the plurality of input channels, wherein each of the plurality of unit channel decoder circuits is configured to process codewords associated with a respective input channel of the plurality of input channels, thereby providing a plurality of processed codewords.

10. The multi-channel decoder circuit of claim 1, wherein a number of unit decoder circuits within the set of unit decoder circuits is less than a number of input channels within the plurality of input channels.

11. The multi-channel decoder circuit of claim 1, wherein the multi-channel decoder circuit is associated with digital subscriber line (xDSL) systems.

12. The multi-channel decoder circuit of claim 1, wherein a number iterations to process the one or more codewords is greater than 1.

13. A multi-channel decoder system, comprising: a multi-channel decoder circuit comprising:
a distributed decoder circuit comprising a set of unit decoder circuits distributed between at least two separate hardware devices, each unit decoder circuit configured to receive one or more codewords of a plurality of codewords associated with a plurality of input channels, and decode the one or more codewords; and
a distribution controller circuit configured to distribute an incoming codeword of the one or more codewords to the respective unit decoder circuit of the set of unit decoder circuits, based on determining a currently available unit decoder circuit within the set of unit decoder circuits and based on a capability of the currently available unit decoder circuit to decode a particular codeword, the capability relating to a predefined condition, and based on a respective predefined quality-of-service (QoS) class for the incoming codeword, the particular codeword being distributed specifically to the currently available unit decoder circuit based on a particular QoS class for the particular codeword.

14. The multi-channel decoder system of claim 13, wherein the distribution controller circuit comprises:
a controller circuit configured to:
identify an arrival of the incoming codeword of the plurality of codewords associated with the plurality of input channels; and
determine the currently available unit decoder circuit within the set of unit decoder circuits, in order to distribute each of the respective incoming codeword.

15. The multi-channel decoder system of claim 14, wherein the distribution controller circuit further comprises:
an input distribution network circuit configured to distribute the incoming codeword of the plurality of codewords associated with the plurality of input channels to a respective unit decoder circuit, based on instructions from the controller circuit; and
an output distribution network circuit configured to distribute decoded codewords from the set of unit decoder circuits to a respective plurality of output channels associated therewith.

16. The multi-channel decoder system of claim 15, further comprising an input buffer circuit comprising a plurality of unit input buffer circuits configured to store incoming codewords associated with a respective input channel of the plurality of input channels and wherein the input distribution network circuit is coupled to the input buffer circuit, in order to distribute the incoming codeword of the plurality of codewords associated with the plurality of input channels to the respective unit decoder circuits.

17. The multi-channel decoder system of claim 16, further comprising an output buffer circuit comprising a plurality of unit output buffer circuits respectively associated with a respective input channel of the plurality of output channels associated therewith, wherein the output buffer circuit is coupled to the output distribution network circuit and wherein each of the unit output buffer circuit within the output buffer circuit is configured to store decoded codewords associated with the respective output channel.

18. The multi-channel decoder system of claim 13, wherein the set of unit decoder circuits are arranged into two or more decoder pool circuits, each decoder pool circuit comprising one or more unit decoder circuits with the predefined QoS class.

19. The multi-channel decoder system of claim 18, wherein the distribution controller circuit is configured to distribute the incoming codeword of the one or more codewords to the respective unit decoder circuit, based on determining the QoS class of the incoming codeword and based on determining the currently available unit decoder circuit within a decoder pool circuit with the a QoS class.

20. The multi-channel decoder system of claim 13, wherein the multi-channel decoder circuit further comprises a dedicated decoder circuit coupled to the distribution controller circuit, and configured to process the plurality of codewords associated with the plurality of input channels, prior to providing the plurality of codewords to the distribution controller circuit, and wherein the dedicated decoder circuit comprises a plurality of unit channel decoder circuits associated with a respective input channel of the plurality of input channels, wherein each of the plurality of unit channel decoder circuits is configured to process codewords associated with a respective input channel of the plurality of input channels, thereby providing a plurality of processed codewords.

21. The multi-channel decoder system of claim 13, wherein a number of unit decoder circuits within the set of unit decoder circuits is less than a number of input channels within the plurality of input channels.

22. The multi-channel decoder system of claim 13, wherein the multi-channel decoder system is associated with digital subscriber line (xDSL) systems.

23. A method for a multi-channel decoder circuit, comprising:

receiving, at each unit decoder circuit of a set of unit decoder circuits, one or more codewords of a plurality of codewords associated with a plurality of input channels, and iteratively processing the one or more codewords; and distributing an incoming codeword of the one or more codewords to the respective unit decoder circuit of the set of unit decoder circuits, by a distribution controller circuit, based on a predefined condition, the predefined condition relating to a quality-of-service (QoS) class of the incoming codeword, the plurality of codewords being distributed based on determining a currently available unit decoder circuit within the set of unit decoder circuits, and based on a respective predefined QoS class for the incoming codeword, wherein distributing the incoming codeword of the one or more codewords to the respective unit decoder circuit of the set of unit decoder circuits includes distributing a particular codeword specifically to the currently available unit decoder circuit based on a particular QoS class for the particular codeword.

24. The method of claim 23, wherein determining the currently available unit decoder circuit within the set of unit decoder circuits comprises determining a unit decoder circuit within the set of unit decoder circuits that is free to decode the incoming codeword.

25. The method of claim 23, wherein determining the currently available unit decoder circuit within the set of unit decoder circuits comprises:

determining a unit decoder circuit within the set of unit decoder circuits that is decoding a codeword that has a lower QoS class than the incoming codeword; and stopping the decoding of the codeword with the lower QoS class, in order to make the unit decoder circuit available for the incoming codeword.

26. The method of claim 23, wherein determining the currently available unit decoder circuit within the set of unit decoder circuits comprises:

determining a unit decoder circuit within the set of unit decoder circuits that has exceeded the maximum delay assigned for processing the current codeword that the unit decoder circuit is processing; and stopping the decoding of the current codeword, in order to make the unit decoder circuit available for the incoming codeword.

27. The method of claim 23, wherein the set of unit decoder circuits are arranged into two or more decoder pool circuits, each decoder pool circuit comprising one or more unit decoder circuits with a predefined QoS class.

28. The method of claim 23, wherein a number of unit decoder circuits within the set of unit decoder circuits is less than a number of input channels within the plurality of input channels.

29. The method of claim 23, wherein a number iterations to process the one or more codewords is greater than 1.

* * * * *